United States Patent [19]

Nagayama et al.

[11] 4,404,661
[45] Sep. 13, 1983

[54] SEMICONDUCTOR MEMORY CIRCUIT

[75] Inventors: Yasuji Nagayama; Makoto Taniguchi, both of Itami, Japan

[73] Assignee: Mitsubishi Denki Kabushiki Kaisha, Tokyo, Japan

[21] Appl. No.: 202,822

[22] Filed: Oct. 31, 1980

[30] Foreign Application Priority Data

Oct. 31, 1979 [JP] Japan ................................ 54-141783

[51] Int. Cl.³ .......................... G11C 7/00; G11C 11/24
[52] U.S. Cl. ...................................... 365/203; 365/204
[58] Field of Search ........................ 365/203, 204, 222; 307/482, 578

[56] References Cited

U.S. PATENT DOCUMENTS

| | | | |
|---|---|---|---|
| 4,061,999 | 12/1977 | Proebsting | 365/203 |
| 4,291,393 | 9/1981 | Wilson | 365/203 |
| 4,327,426 | 4/1982 | McAdams | 365/203 |

OTHER PUBLICATIONS

S. S. Sheffield, "A 5V-Only 2Kx8 Dynamic RAM," 1979 IEEE International Solid-State Circuits Conference, Digest of Technical Papers, pp. 144, 145.
J. M. Lee, "A 80ns 5V-Only Dynamic RAM," 1979 IEEE International Solid-State Circuits Conference, Digest of Technical Papers, pp. 142, 143.

*Primary Examiner*—James W. Moffitt
*Attorney, Agent, or Firm*—Sughrue, Mion, Zinn, Macpeak & Seas

[57] ABSTRACT

A MOSRAM type semiconductor memory circuit in which the storage charge per bit cell is increased without a corresponding increase in per bit chip area. A potential decision circuit is provided for each bit line in the memory for setting a potential on the corresponding bit line. A boost circuit is provided for increasing the potential on each bit line in accordance with the operation of the potential decision circuit. One boost circuit may be provided for each bit line. Alternatively, a boost circuit may be provided common to all bit lines or a plurality of bit lines in the memory circuit.

5 Claims, 6 Drawing Figures

SEMICONDUCTOR MEMORY CIRCUIT

BACKGROUND OF THE INVENTION

The present invention relates to semiconductor memory circuits. More particularly, the invention relates to a dynamic random access memory utilizing a MOS FET, hereinafter referred to as "a MOST." The memory itself is termed a MOSRAM.

In general, in a MOSRAM of the single-transistor, single-capacitor type, the chip area per bit is made small in order to prevent the total chip area from being larger than practical limits due to the desired large capacity of the memory. Accordingly, because of the small area per bit, a MOSRAM of this general type can store only a small amount of charge per bit. However, the small amount of charge stored per bit in each memory cell results in a small safe operational margin for reading data from the memory and increases the amount of "soft" error due to $\alpha$ rays. In order to overcome these difficulties, it is necessary that even a MOSRAM having a large capacity be so designed that the amount of charge stored per bit is not overly small.

The amount of charge Q stored in a memory cell in a MOSRAM of the single-transistor, single-capacitor type can, in general, be represented by the following equation:

$$Q = C_s \cdot V_s \qquad (1)$$

where Cs is the capacitance of the memory cell and Vs is the writing voltage of the memory cell.

As is apparent from the equation (1), the value Q can be increased by increasing the capacitance Cs or the voltage Vs. However, it is not practical to increase the capacitance because it is necessary to minimize the cell area per bit in order to provide a large capacity memory. On the other hand, the voltage Vs may be increased because to do so does not affect the chip area and, accordingly, such a memory may be realized merely by suitably designing the drive circuitry therefor.

FIG. 1 is a circuit diagram showing the arrangement of a conventional circuit for rewriting data into a memory cell. In this circuit, a voltage difference read out of the memory cell is amplified by a sense amplifier and the voltage thus amplified is written back into the memory cell directly. The associated charging circuit is not shown in FIG. 1.

In FIG. 1, reference character BL designates a bit line, MC a memory cell, DC a dummy cell, SA a sense amplifier circuit including a flip-flop, Q1, Q2, Q3 and Q4 MOSTs of the sense amplifier circuit, C1 and C2 signal terminals for activating the sense amplifier circuit, Q5 and Q6 MOSTs for precharging the bit line, C3 and C3 signal terminals for precharging the bit line, C4 a signal line for connecting the bit line to the memory cell, Q7 a MOST in the memory cell, Cs a storage capacitor in the memory cell, and N1, N2, N3, N4 and N5 connection points.

The circuit in FIG. 1 operates as follows. After signals read out of the memory cell MC and the dummy cell DC are transmitted to the bit line BL, the signal terminal C1 is grounded to Vss to activate the sense amplifier circuit SA so that the small signal difference between the connection points N1 and N2 on the bit line is amplified. The bit line BL is maintained precharged to $V_{DD}$ until a signal from the memory cell MC is transmitted thereto. The MOSTs Q3 and Q4 are provided to prevent a decrease in the potential of the side whose potential is raised after amplification.

If a logical "1" or "H" (high potential) has been stored in the memory cell MC, the connection point N2 is at the high potential; however, it is lower by $V_{th}$, corresponding to the threshold voltage of the MOST Q7, than $V_{DD}$. Therefore, if the potential on the signal line C4 is $V_{DD}$, the potential at the connection point N5 is $V_{DD} - V_{th}$ and the maximum potential $V_{DD} - V_{th}$ is rewritten into or stored by the capacitor Cs of the memory cell MC.

A circuit for writing the potential $V_{DD}$ into the memory cell MC during the operation of the circuit has been proposed in the art, an example of which is shown in FIG. 2. The circuit shown in FIG. 2 can be formed by connecting recharge circuits RC to both connection points of the bit line in the circuit shown in FIG. 1. In FIG. 2, reference characters Q8 and Q9 designate MOSTs in the recharge circuit, C5 a signal terminal of the recharge circuit, CP1 a bootstrap capacitor in the recharge circuit, and N6 a connection point in the recharge circuit.

The circuit of FIG. 2 operates the same as the circuit of FIG. 1 until the potential $V_{DD} - V_{th}$ is rewritten. After the potential rewriting operation, the potential of the signal line C4 is raised to a level higher than $V_{DD} + V_{th}$ and the level of a clock pulse applied to the signal terminal C5 is raised to "H" from "L" so that the potential of the connection point N6 is raised to a level higher than $V_{DD} + V_{th}$ and the connection point N2 is recharged to $V_{DD}$. As the signal line C4 is at a potential higher than $V_{DD} + V_{th}$, the potential $V_{DD}$ is written through the connection point N5 into the capacitor Cs of the memory cell MC. The recharge circuit RC is recharged only when the connection point N2 is raised to the high potential. When the connection point N2 is set to the zero potential, the connection point N6 is also set to the zero potential and therefore the recharge circuit RC is not recharged. Accordingly, no power is unnecessarily consumed in the recharge circuit RC.

Recently, a large capacitance MOSRAM has been developed which uses a short channel. This device requires a lower $V_{DD}$ than the circuit described above because of the voltage withstanding property of the MOST. Thus, typically a 5 V power source must be used for a dynamic 64K MOSRAM or 16K MOSRAM of this type. However, in this case, the voltage Vs in the above-described expression (1) is decreased and the amount of charge stored in the memory cell is decreased. This is a serious problem which remains to be solved.

Accordingly, in view of the foregoing, an object of the invention is to provide a circuit for increasing the storage charge of a dynamic MOSRAM.

SUMMARY OF THE INVENTION

This, as well as other objects of the invention, are met by a MOSRAM type semiconductor memory circuit including a plurality of bit lines, a potential decision circuit provided for each bit line for setting a potential on each bit line, and a boost circuit for increasing a potential on each bit line in accordance with the operation of the potential decision circuit. One boost circuit may be provided for each bit line or a single boost circuit provided common to all or a plurality of the bit lines.

In one preferred embodiment, the potential decision circuit includes first, second, and third MOST transistors. The first MOST transistor has a first signal electrode coupled to the bit line and a gate electrode coupled to a bias potential source while the gate electrode of the second MOST transistor is coupled to the second signal electrode of the first MOST transistor. As used herein, the term "signal electrode" refers to either of the drain or source of the MOST transistor. The first signal electrode of the third MOST transistor is coupled to the first signal electrode of the first MOST transistor while its gate electrode is coupled to the second signal electrode of the second MOST transistor and through a capacitor to a second connection point. In this case, the boost circuit includes a fourth MOST transistor having a first signal electrode coupled to the second signal electrode of the third MOST transistor in the potential decision circuit and a second signal electrode and gate electrode coupled to the bias voltage source. A second capacitor is coupled between the first signal electrodes of the fourth MOST transistor and ground while a third capacitor is coupled between the first signal electrode of the fourth MOST transistor and a third connection point.

In another preferred embodiment, the potential decision circuit includes first and second MOST transistors both of which have a first signal electrode coupled to the corresponding bit line. The gate electrode of the first MOST transistor is coupled to a bias voltage source while the gate electrode of the second MOST transistor is coupled to the second signal electrode of the first MOST transistor with the same point coupled through a first capacitor to a first connection point. The boost circuit in this case includes a third MOST transistor having a first signal electrode coupled to the second signal electrode of the second MOST transistor and a second signal electrode and gate electrode coupled to the bias voltage source. A second capacitor is coupled between the first signal electrode of the third MOST transistor and a second connection point.

DESCRIPTION OF THE PREFERRED EMBODIMENTS

Examples of a semiconductor memory circuit constructed according to the present invention will be described with reference to FIGS. 3A and 3B and FIGS. 4A and 4B.

Figure 1:
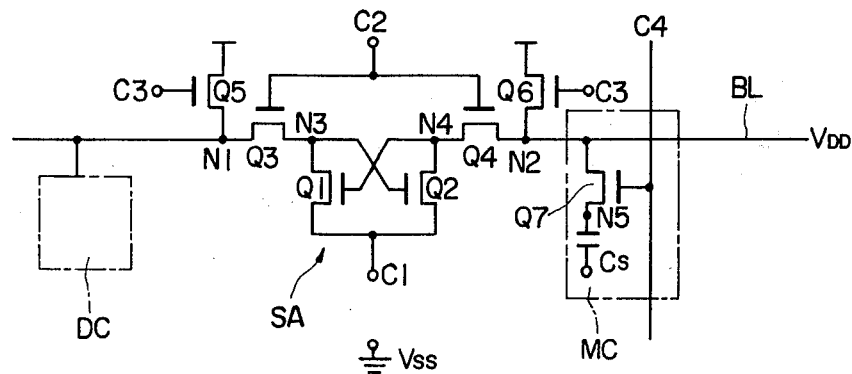
FIG. 1 and FIG. 2 are circuit diagrams showing conventional MOSRAMs.
Figure 2:
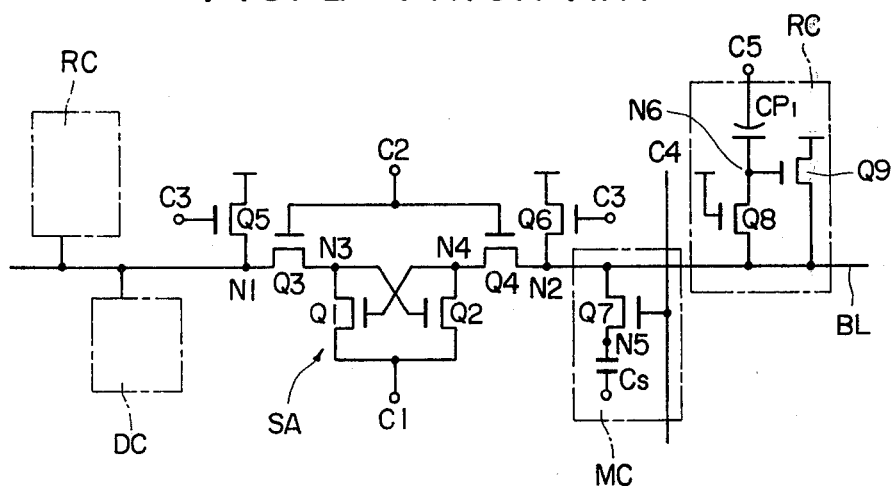
Figure 3A:
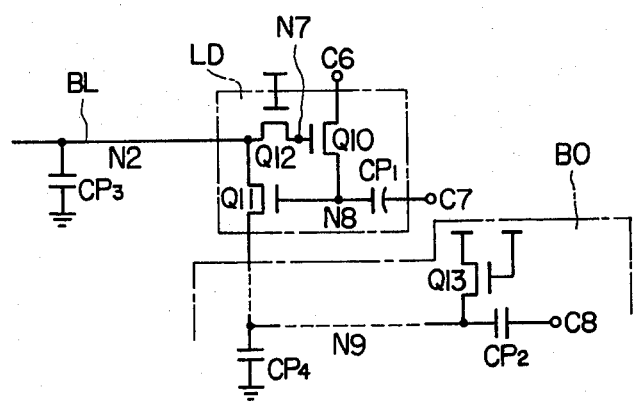
FIGS. 3A and 3B are, respectively, a circuit diagram of a first embodiment of a semiconductor memory circuit according to the invention and a waveform diagram showing various signals in the circuit of FIG. 3A.
Figure 3B:
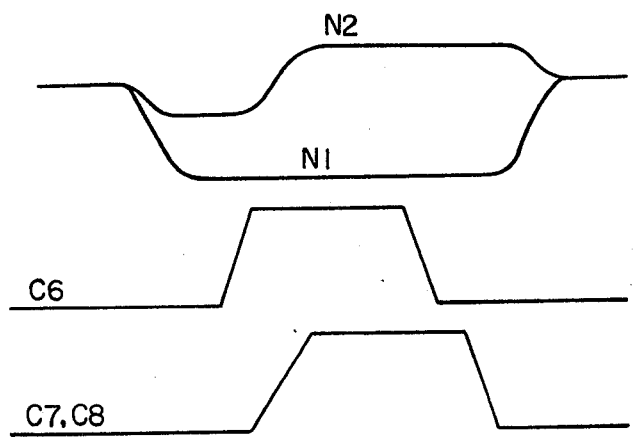

FIG. 3A shows a first preferred embodiment of a semiconductor memory circuit according to the invention. It should be noted that FIG. 3A shows only the essential components of the memory circuit of the invention and the sense amplifier circuit SA, the memory cell MC and the dummy cell DS are not shown in FIG. 3A. FIG. 3B shows the waveforms of various signals in the circuit.

In FIG. 3A, reference character LD designates a potential decision provided for each bit line BL; BO a boost circuit provided common to the bit lines BL; Q10, Q11 and Q12 MOSTs in the potential decision circuit; CP1 a boostrap capacitor in the potential decision circuit; C6 and C7 signal terminals of the circuit LD; N7 and N8 connection points in the circuit LD; Q13 a MOST in the boost circuit BO; CP2 a capacitor in the boost circuit BO; C8 a signal terminal of the boost circuit BO; and N9 a connection point in the boost circuit BO.

In the circuit shown in FIG. 3A, when similarly to the previously described circuits the sense amplifier SA is operated and the connection point N2 of the bit line BL is raised to the high potential, the connection point N7 is also raised to the high potential. Thereafter, when the signal terminal C6 is raised from "L" to "H", the MOST Q10 operates as a self boostrap so that the connection point N7 is maintained at a sufficiently high voltage and, therefore, the voltage at the connection point N8 is made lower than that at the signal terminal C6 thus rendering the MOST Q10 non-conductive. On the other hand, the connection point N9 of the boost circuit BO is precharged through the MOST Q13 to the potential $V_{DD} - V_{th}$. When, under this condition, the signal terminals C7 and C8 are raised to "H" from "L," the connection points N8 and N9 are raised to the high potential and the connection point N2 of the bit line is also raised to the high potential.

With the number of sense amplifier circuits being n, the stray capacitance of the connection point N9 being CP4, and the capacitance of the bit line CP3, the potential $V_B$ of the bit line is:

$$V_B = \frac{V_{DD} \cdot CP2}{n\ CP3 + CP4 + CP2} + (V_{DD} - V_{th}) \quad (2)$$

As is clear from the equation (2), by properly selecting the capacitance CP2, the bit line BL can be raised to a potential of $V_B = V_{DD} + V_{th}$. However, it is necessary that the gate voltage (word line) of the pass transistor Q7 in the memory cell MC be raised to a level higher than $V_{DD} + 2\ V_{th}$.

Figure 4A:
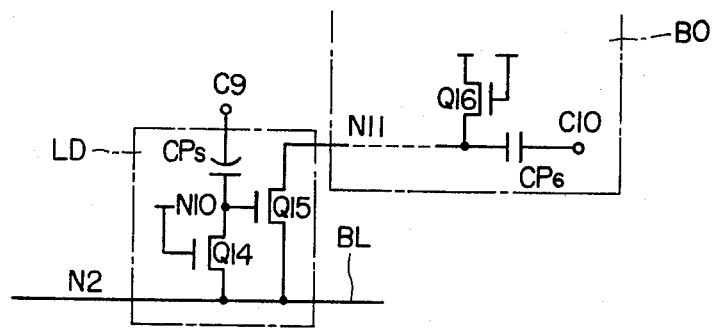
FIGS. 4A and 4B are a circuit diagram showing a second embodiment of a semiconductor memory circuit according to the invention and a waveform diagram showing various signals in the circuit of FIG. 4A.
Figure 4B:
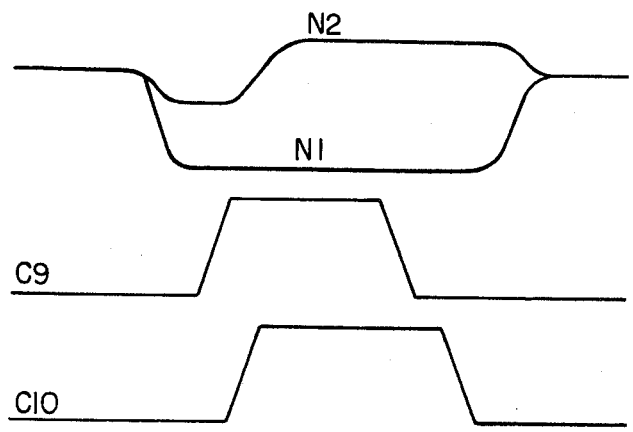

FIG. 4A shows a second preferred embodiment of a semiconductor memory circuit according to the invention and FIG. 4B shows the waveforms of various signals in the circuit. Similar to FIG. 3A, FIG. 4A shows only the essential components of the circuit. Here, a potential decision circuit LD is provided for each bit line and a boost circuit BO is provided common to the bit lines BL.

In the circuit of FIG. 4A also, when the sense amplifier circuit SA is operated and the connection point N2 of the bit line BL is raised to the high potential, the connection point N10 is raised through the MOST Q14 to the high potential. Thereafter, when the signal terminal C9 is raised to "H" from "L," the connection point N10 is raised to a sufficiently high potential as a result of which the MOST Q15 is rendered conductive. The connection point N11 is precharged to $V_{DD} - V_{th}$. Therefore, when the signal terminal is raised to "H" from "L", similarly, the connection point N2 of the bit line is raised to the high potential.

In each of the above-described embodiments, a potential decision circuit is provided for each bit line and a single boost circuit is provided common to the bit lines. However, a separate boost circuit may be provided for each bit line.

Furthermore, both N-channel type MOSTs and P-channel type MOSTs can be used as a MOST in the above-described embodiments. Moreover, while the gates of the MOSTs $Q_{13}$ and $Q_{16}$ are coupled to the $V_{DD}$ in the above described embodiment, modifications are possible without departing from the essential scope of the invention by controlling the gate potential with a clock signal so that the MOSTs $Q_{13}$ and $Q_{16}$ are rendered non-conductive when the potential decision circuit LD and the boost circuit BO are activated.

What is claimed is:

1. A semiconductor memory circuit of the MOS-RAM type comprising:

a plurality of bit lines;

a sense amplifier provided for each bit line for sensing a state of a storage cell selectively coupled to said bit line and for setting said bit line to one of first and second predetermined potentials in response to the sensed state;

a potential decision circuit provided for each bit line for sensing the potential on the corresponding bit line set by said sense amplifier; and a boost circuit operating in response to an output from said potential decision circuit for increasing a potential on the corresponding bit line above a maximum supply potential when said potential decision circuit senses the presence of a predetermined one of said first and second potentials on said bit line for recharging said selected storage cell at a potential above said maximum supply potential.

2. The semiconductor memory circuit of claim 1 wherein one said boost circuit is provided for each bit line.

3. The semiconductor memory circuit of claim 1 wherein said boost circuit is provided common to all said bit lines.

4. The semiconductor memory circuit of any of claims 1-3 wherein said potential decision circuit comprises a first MOST transistor having a first signal electrode coupled to a corresponding bit line and a gate electrode coupled to a bias voltage source; a second MOST transistor having a gate electrode coupled to a second signal electrode of said first MOST transistor and a first signal electrode coupled to a first connection point; a third MOST transistor having a first signal electrode coupled to said first signal electrode of said first MOST transistor and a gate electrode coupled to a second signal electrode of said second MOST transistor; and a first capacitor having a first terminal coupled to said second signal electrode of said second MOST transistor and a second terminal coupled to a second connection point; and wherein said boost circuit comprises a fourth MOST transistor having a first signal electrode coupled to a second signal electrode of said third MOST transistor and a second signal electrode and a gate electrode coupled to said bias voltage source; a second capacitor coupled between said first electrode of said fourth MOST transistor and ground; and a third capacitor coupled between said first signal electrode of said MOST transistor and a third connection point.

5. The semiconductor memory circuit of any of claims 1-3 wherein said potential decision circuit comprises a first MOST transistor having a first signal electrode coupled to a corresponding bit line and a gate electrode coupled to a bias voltage source; a second MOST transistor having a first signal electrode coupled to said bit line and a gate electrode coupled to a second signal electrode of said first MOST transistor; and a first capacitor having a first terminal coupled to said gate of said second MOST transistor and a second terminal coupled to a first connection point; and wherein said boost circuit comprises a third MOST transistor having a first signal electrode coupled to a second signal electrode of said second MOST transistor and a second signal electrode and gate electrode coupled to said bias voltage source; and a second capacitor having a first terminal coupled to said first signal electrode of said third MOST transistor and a second terminal coupled to a second connection point.

* * * * *